(12) United States Patent
Yu et al.

(10) Patent No.: US 11,333,915 B2
(45) Date of Patent: May 17, 2022

(54) COVER, DISPLAY DEVICE, AND METHOD FOR MANUFACTURING DISPLAY DEVICE

(71) Applicant: WUHAN CHINA STAR OPTOELECTRONICS TECHNOLOGY CO., LTD., Wuhan (CN)

(72) Inventors: Pengfei Yu, Wuhan (CN); Tao Song, Wuhan (CN)

(*) Notice: Subject to any disclaimer, the term of this patent is extended or adjusted under 35 U.S.C. 154(b) by 278 days.

(21) Appl. No.: 16/632,354

(22) PCT Filed: Nov. 6, 2019

(86) PCT No.: PCT/CN2019/116085
§ 371 (c)(1),
(2) Date: Jan. 19, 2020

(87) PCT Pub. No.: WO2021/017254
PCT Pub. Date: Feb. 4, 2021

(65) Prior Publication Data
US 2021/0405432 A1   Dec. 30, 2021

(30) Foreign Application Priority Data
Jul. 26, 2019 (CN) .......................... 201910682181.3

(51) Int. Cl.
*G02F 1/1333* (2006.01)
*G02F 1/1335* (2006.01)
(Continued)

(52) U.S. Cl.
CPC .... *G02F 1/133331* (2021.01); *G02F 1/13338* (2013.01); *G02F 1/133512* (2013.01); *G02F 1/133531* (2021.01); *H01L 27/3234* (2013.01); *H01L 51/5284* (2013.01); *H01L 51/5293* (2013.01); *H01L 51/56* (2013.01); *H04M 1/0264* (2013.01); *H04N 5/2257* (2013.01)

(58) Field of Classification Search
CPC .............. H01L 27/3234; H04M 1/0264; G02F 1/133512; G02F 1/133331
See application file for complete search history.

(56) References Cited

U.S. PATENT DOCUMENTS

2016/0254174 A1   9/2016  Chang
2020/0117034 A1*  4/2020  Yin .................... H04N 7/142
(Continued)

FOREIGN PATENT DOCUMENTS

| CN | 108845452 A | 11/2018 |
|----|-------------|---------|
| CN | 108983469 A | 12/2018 |
| CN | 109283736 A | 1/2019  |

*Primary Examiner* — Jessica M Merlin

(57) ABSTRACT

The present disclosure provides a cover, a display device, and a method for manufacturing the display device. By forming a first via hole in an electronic component disposing region when an optically clear adhesive is formed on the cover, via holes are formed because the optically clear adhesive cannot form in the electronic component disposing region. Thus, the optically clear adhesive does not have portions having different thicknesses, thereby preventing bubbles from forming in a blind hole region, and solving technical problems of the existing display device that the OCA has bubbles around the corresponding blind hole region, which affects photographing quality.

12 Claims, 5 Drawing Sheets

(51) Int. Cl.
*H01L 27/32* (2006.01)
*H01L 51/52* (2006.01)
*H01L 51/56* (2006.01)
*H04M 1/02* (2006.01)
*H04N 5/225* (2006.01)

(56) References Cited

U.S. PATENT DOCUMENTS

2020/0286436 A1* 9/2020 Lim .................... G02F 1/1335
2021/0200020 A1* 7/2021 Kim .................... H01L 27/3234

\* cited by examiner

COVER, DISPLAY DEVICE, AND METHOD FOR MANUFACTURING DISPLAY DEVICE

FIELD OF INVENTION

The present disclosure relates to the field of display technologies, and more particularly, to a cover, a display device, and a method for manufacturing the display device.

BACKGROUND OF INVENTION

In present display technologies, an optically clear adhesive (OCA) is usually utilized to adhere a polarizer a cover. For products with a camera disposed under the display panel, a blind hole is formed in the polarizer. Therefore, a height difference between a part of the OCA corresponding to the blind hole and a part of the OCA corresponding to other regions exists. When eliminating bubbles in the OCA, certain bubble accumulation occurs around the blind hole, which affects photographing quality.

Therefore, the existing display device has technical problems that the OCA has bubbles around the blind hole, which affects the photographing quality.

Technical Problems

The present disclosure provides a cover, a display device, and a method for manufacturing the display device for solving problems of the existing display device that the OCA has bubbles around the blind hole, which affects the photographing quality.

SUMMARY OF INVENTION

For solving the above-mentioned problems, the present disclosure provides following technical solutions.

The present disclosure provides a cover including a first via hole. The via hole is disposed in an electronic component disposing region corresponding to a location for disposing an electronic component, and the electronic component collects lights through the first via hole.

In the cover provided by the present disclosure, the cover includes a transparent layer at least disposed in a display region corresponding to a display position, the display region disposed around the electronic component disposing region.

In the cover provided by the present disclosure, a material of the transparent layer includes transparent glass.

In the cover provided by the present disclosure, the cover further includes an ink layer disposed in a light-blocking region, and a thickness of the ink layer is equal to a thickness of the transparent layer, wherein the light-blocking region locates between the display region and the electronic component disposing region.

In the cover provided by the present disclosure, the cover further includes an ink layer, the transparent layer is further disposed at a light-blocking region, and the ink layer is disposed above the transparent layer, wherein the light-blocking region locates between the display region and the electronic component disposing region.

In the meanwhile, the present disclosure provides a display device including:

A cover includes a first via hole. The via hole is disposed in an electronic component disposing region corresponding to a location for disposing an electronic component, and the electronic component collects lights through the first via hole.

An optically clear adhesive is disposed under the cover and provided with a second via hole in the electronic component disposing region.

A polarizer is disposed under the optically clear adhesive and provided with a third via hole in the electronic component disposing region.

A display panel is disposed under the polarizer.

The first via hole, the second via hole, and the third via hole at least partially overlap to each other.

In the display device provided by the present disclosure, the display device further includes a protective layer disposed on the cover, an area of a projection of the protective layer projecting on the display panel is equal to an area of the display panel.

In the display device provided by the present disclosure, the display panel is provided with a fourth via hole in the electronic component disposing region.

In the display device provided by the present disclosure, a cross-section width of the first via hole, a cross-section width of the second via hole, and a cross-section width of the third via hole are equal, and the cross-section width of the first via hole is greater than a cross-section width of the fourth via hole.

In the display device provided by the present disclosure, the display panel includes a liquid crystal display panel or an organic light-emitting diode display panel.

In the display device provided by the present disclosure, the display device further includes the electronic component. The electronic component includes a camera.

In the display device provided by the present disclosure, the cover includes a transparent layer at least disposed in a display region corresponding to a display position, the display region disposed around the electronic component disposing region.

In the display device provided by the present disclosure, a material of the transparent layer includes transparent glass.

In the display device provided by the present disclosure, the cover further includes an ink layer disposed in a light-blocking region. A thickness of the ink layer is equal to a thickness of the transparent layer. The light-blocking region locates between the display region and the electronic component disposing region.

In the display device provided by the present disclosure, the cover further includes an ink layer, the transparent layer is further disposed under the a light-blocking region, and the ink layer is disposed above the transparent layer, wherein the light-blocking region locates between the display region and the electronic component disposing region.

In the meanwhile, the present disclosure provides a method for manufacturing the display device including:

Providing a display panel.

Adhering a polarizer on the display panel, wherein the polarizer is provided with a third via hole in an electronic component disposing region corresponding to a location for disposing an electronic component.

Adhering the polarizer and a cover by utilizing an optically clear adhesive, wherein the cover is provided with a first via hole in the electronic component disposing region, and the optically clear adhesive is provided with a second via hole in the electronic component disposing region.

In the method for manufacturing the display device provided by the present disclosure, the step of adhering the polarizer and the cover by utilizing the optically clear adhesive includes:

Providing the cover.

Providing the optically clear adhesive on the cover.

Forming the first via hole in the electronic component disposing region on the cover and forming the second via hole on the optically clear adhesive. A projection of the first via hole projecting on the display panel at least partially overlaps a projection of the second via hole projecting on the display panel.

Adhering the cover and the polarizer through the optically clear adhesive.

In the method for manufacturing the display device provided by the present disclosure, the step of adhering the polarizer and the cover by utilizing the optically clear adhesive includes:

Providing the cover with the first via hole in the electronic component disposing region.

Providing the optically clear adhesive on the cover wherein the optically clear adhesive is provided with the second via hole in the electronic component disposing region.

Adhering the cover and the polarizer through the optically clear adhesive.

In the method for manufacturing the display device provided by the present disclosure, the step of providing the cover includes:

Providing a transparent layer.

Forming an ink layer in a light-blocking region to obtain the cover, wherein the first via hole is provided on the ink layer in the electronic component disposing region. A thickness of the transparent layer is equal to a thickness of the ink layer, and the light-blocking region is disposed between a display region and the electronic component disposing region.

In the method for manufacturing the display device provided by the present disclosure, the step of providing the cover includes:

Providing a transparent layer and forming the first via hole in the electronic component disposing region.

Forming an ink layer in a light-blocking region to obtain the cover, wherein the light-blocking region is disposed between a display region and the electronic component disposing region.

Beneficial Effects

The present disclosure provides a cover, a display device, and a method for manufacturing the display device.

A first via hole is formed in an electronic component disposing region corresponding to a location for disposing an electronic component. The electronic component collects light through the first via hole. By forming the first via hole on a cover, an optically clear adhesive cannot form in a region corresponding to the first via hole when the optically clear adhesive is formed on the cover. Thus, the optically clear adhesive also forms a via hole corresponding to the electronic component disposing region, so that the optically clear adhesive does not have portions having different thicknesses. Moreover, there is no optically clear adhesive in the electronic component disposing region. Thereby, problems resulted from bubbles forming in a blind hole region are prevented. The technical problems of photographing quality being affected by the existing display device which has bubbles correspondingly forming around the blind hole region are solved.

DETAILED DESCRIPTION OF PREFERRED EMBODIMENTS

In order to clarify embodiments or technical solutions of the present technologies, the required drawings of the embodiments or the technical solutions will be briefly described below. Obviously, the drawings in the following description are merely parts of embodiments. Additional drawings may be obtained by a skilled person in the art without creative effort according to the following drawings FIG. 1 illustrates a diagram of a present display device.

DETAILED DESCRIPTION OF PREFERRED EMBODIMENTS

Figure 1:
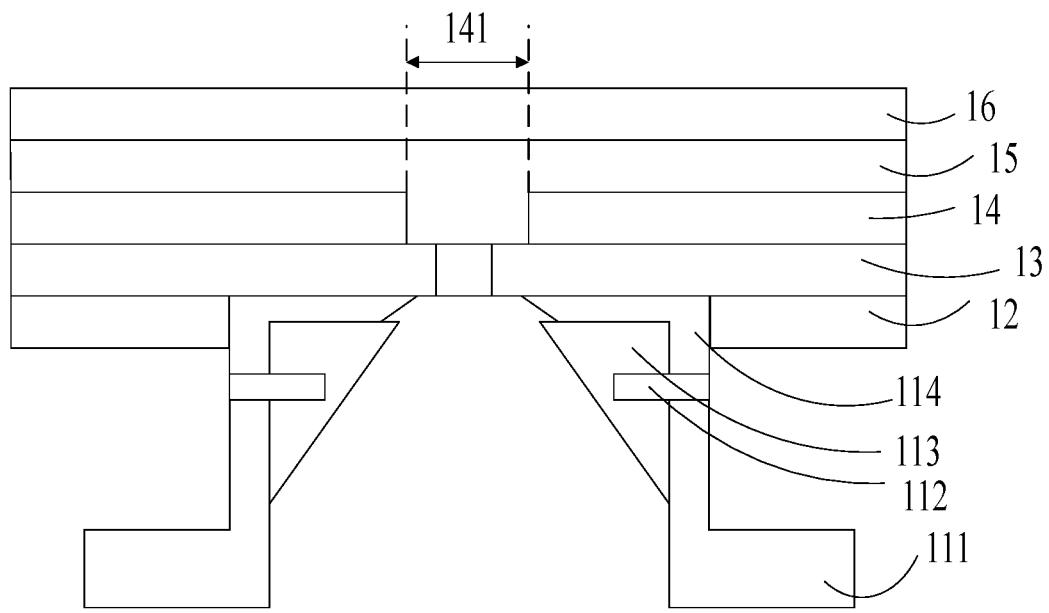

The following description of the various embodiments is provided with reference of drawings to illustrate specific embodiments. Directional terms mentioned in the present disclosure, such as upper, lower, front, back, left, right, inside, outside, lateral, etc., are only referring to the direction of the drawing. Therefore, the directional terms used to describe and clarify the present disclosure should not be viewed as limitations of the present disclosure. In the drawing, structurally similar elements are denoted by the same reference numbers.

The present disclosure solves problems of the existing display device that the OCA has bubbles around the blind hole, which affects the photographing quality.

As shown in FIG. 1, a present liquid crystal display (LCD) device includes a backboard 111, a mid-frame 112, a first light-blocking adhesive 113, a second light-blocking adhesive 114, a lower polarizer 12, an LCD panel 13, an upper polarizer 14, an optically clear adhesive (OCA) 15, and a cover 16. Because a camera is disposed under the display panel, the upper polarizer will open a hole in an area corresponding to the camera to form a blind hole. When adhering the cover to the upper polarizer by the OCA, the OCA is filled into the blind hole. Therefore, a thickness difference between a part of the OCA corresponding to the blind hole 141 and a part of the OCA corresponding to other regions exists. When subsequently eliminating bubbles in the OCA, certain bubble accumulation occurs around the blind hole region, which affects photographing quality. The OCA of the existing display device has bubbles around the blind hole region, which causes technical problems of the photographing quality being affected.

Figure 2:
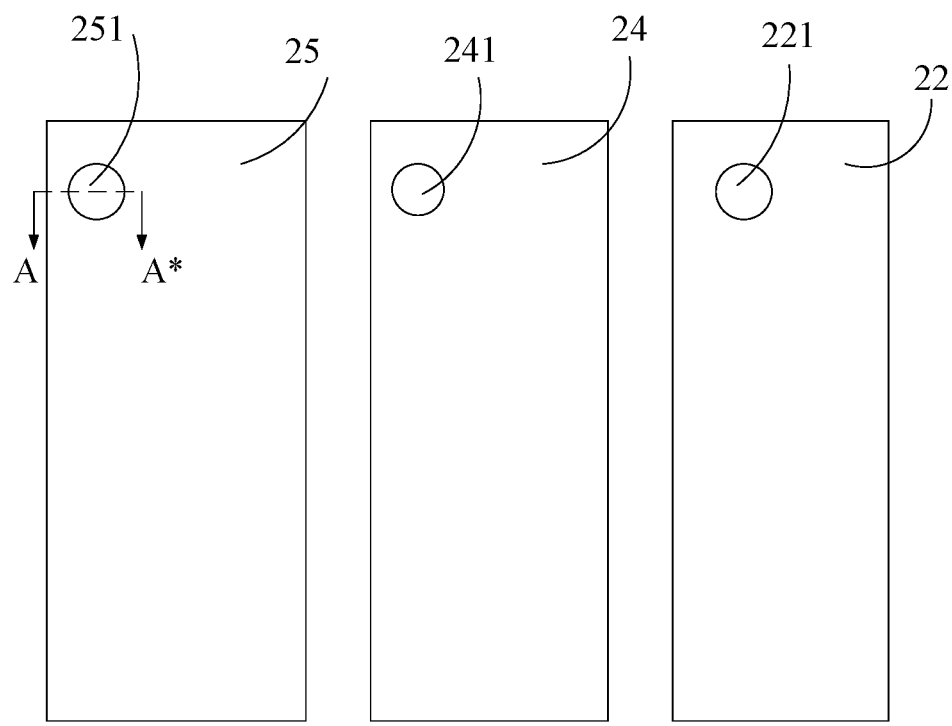
FIG. 2 illustrates a top view of a display device of an embodiment of the present disclosure.

As shown in FIG. 2, an embodiment of the present application provides a top view of a display device. The display device includes a display panel 22, an optically clear adhesive (OCA) 24, and a cover 25. The optically clear adhesive 24 is provided with a second via hole 241 in an electronic component disposing region 221. The cover 25 is provided with a first via hole 251 in the electronic component disposing region 221.

Figure 3:
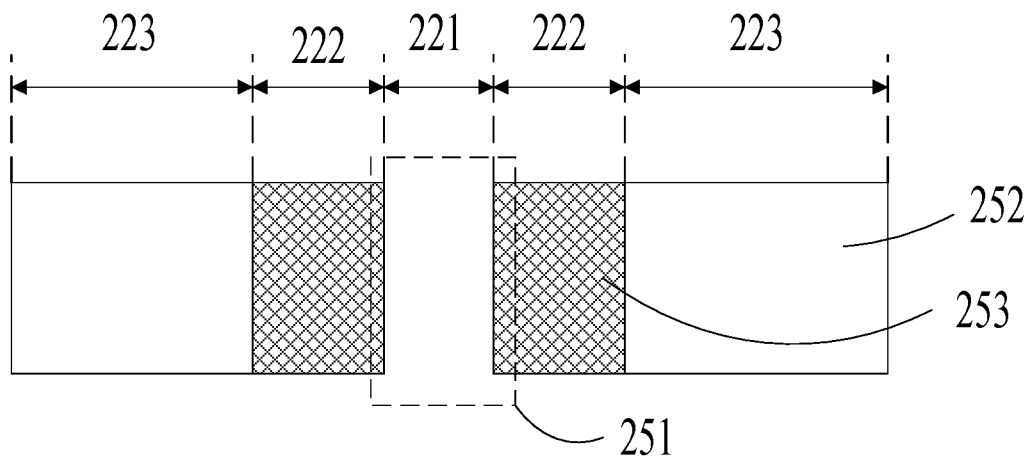
FIG. 3 illustrates a first cross-sectional view from an A-A* line of a cover of the embodiment of the present disclosure.

As shown in FIG. 3, an embodiment of the present application provides a cover. The cover forms the first via hole 251 in the electronic component disposing region 221 corresponding to the position where the electronic component is disposed. The electronic component collects light through the first via hole 251.

The present disclosure provides the cover including the first via hole disposed in the electronic component disposing region corresponding to the location for disposing the electronic component. By forming the first via hole on the cover, when the optically clear adhesive is formed on the cover, the optically clear adhesive cannot be formed in a region corresponding to the first via hole. Thus, a via hole is also formed in the optically clear adhesive corresponding to the electronic component disposing region so that thickness difference of the optically clear adhesive do not exist. Furthermore, there is no optically clear adhesive in the optical component disposing region, thus problems of bubbles around the blind hole region in the optically clear adhesive of the present display device and problems of photography quality being affected are solved.

In an embodiment, as shown in FIG. 3, the cover includes a transparent layer 252 disposed in a display region 223 corresponding to a display region. The display region 223 is disposed around the electronic component disposing region 221. In order to improve the display quality, the cover is provided with a via hole so that light can be transmitted through the cover in the display region. Thus, the display quality is improved.

In one embodiment, a material of the transparent layer includes a transparent glass. In order to protect film layers such as the display panel and the polarizer layer, the transparent layer of the cover can adopt the transparent glass, so that the display panel and the polarizer can be protected without affecting the display effect.

In an embodiment, as shown in FIG. 3, the cover further includes an ink layer 253 disposed in a light-blocking region 222. A thickness of the ink layer 253 is equal to a thickness of the transparent layer 252. The light-blocking region 222 is located between the display region 223 and the electronic component disposing region 221. When the electronic components collect light, in order to prevent reflection and refraction of light in the display region of the cover from occurring during light collection of the electronic component, the ink layer is utilized in the light-blocking region of the cover so that light in the display region does not affect light collection of the electronic component disposing region, and light collection of the electronic component disposing region does not affect the display region, thereby improving effect of light collection of the electronic component disposing region.

Figure 4:
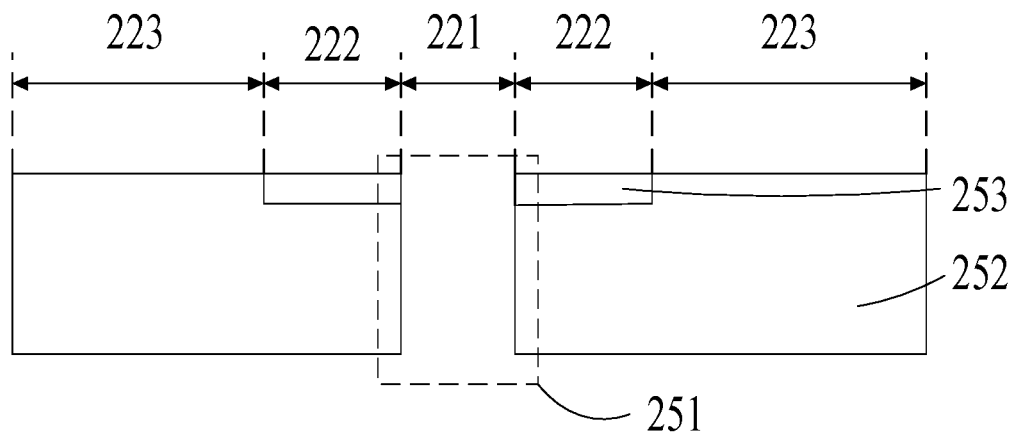
FIG. 4 illustrates a second cross-sectional view from the A-A* line of the cover of the embodiment of the present disclosure.

In an embodiment, as shown in FIG. 4, the cover further includes the ink layer 253. The transparent layer 252 is disposed in the light-blocking region 222. The ink layer 253 is disposed on the transparent layer 252. The light-blocking region 222 is located between the display region 223 and the electronic component disposing region 221. To prevent the reflection and refraction of light when the electronic component collects light, after disposing the transparent layer in the light-blocking region and the display region, the ink layer can be disposed on the light-blocking region and the transparent layer for improving the light collection in the electronic component disposing region. Moreover, the relationship between a thickness of the ink layer and a thickness of the transparent layer in the light-blocking region is not limited if the cover is flat.

Figure 5:
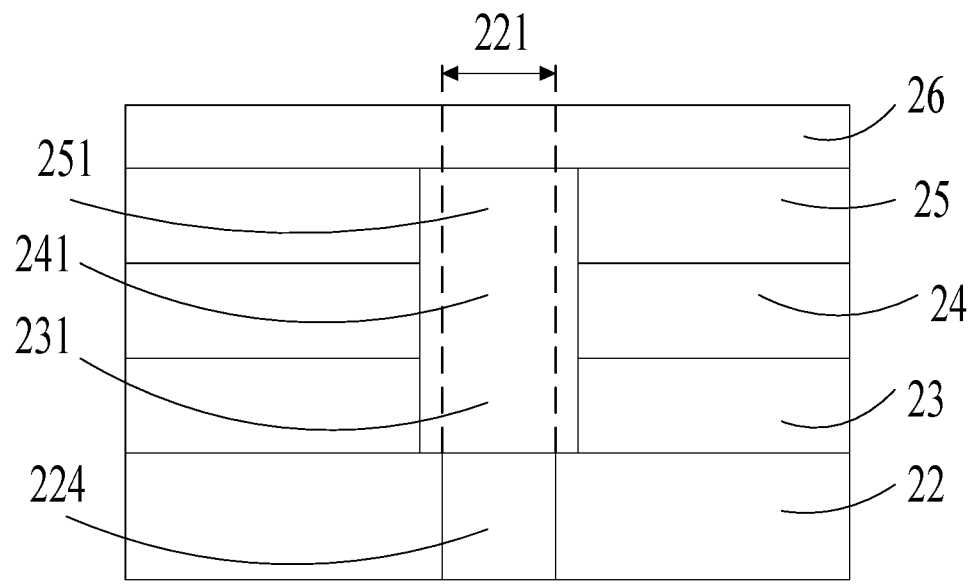
FIG. 5 illustrates a cross-sectional view from an A-A* line of a display device of an embodiment of the present disclosure.

As shown in FIG. 5, the embodiment of the present application provides the display device, and the display device includes following components.

The cover 25 forms the first via hole 251 in the electronic component disposing region 221 corresponding to a position in which the electronic component is disposed. The electronic component collects light passing through the first via hole 251.

The optically clear adhesive 24 is disposed under the cover 25. The second via hole 241 is formed in the electronic component disposing region 221.

The polarizer 23 is disposed under the optically clear adhesive 24. The third via hole 231 is formed in the electronic component disposing region 221.

The display panel 22 is disposed under the polarizer 23.

The first via hole 251, the second via hole 241, and the third via hole 231 have overlapping portions.

The embodiment of the present disclosure provides the display device including the cover, the optically clear adhesive, the polarizer, and the display panel. The cover forms the first via hole in the electronic component disposing region corresponding to the location for disposing the electronic component. The electronic component collects light through the first via hole. The optically clear adhesive is disposed under the cover and is provided with the second via hole in the electronic component disposing region. The polarizer is disposed under the optically clear adhesive and is provided with the third via hole in the electronic component disposing region. The display panel is disposed under the polarizer, wherein the first via hole, the second via hole, and the third via hole have overlapping portions. By forming the first via hole on the cover, the optically clear adhesive is not formed in the region corresponding to the first via hole when the optically clear adhesive is formed on the cover. Thus, the optically clear adhesive also forms the second via hole corresponding to the electronic component disposing region, so that the optically clear adhesive does not have portions having different thicknesses. There is no optically clear adhesive in the optical component disposing region. The first via hole, the second via hole, and the third via hole have overlapping portions, so that light is transmitted to the electronic component through the first via hole, the second via hole, and the third via hole. The problems resulting from bubbles forming in the blind hole region are solved. The technical problems of the existing display device that the OCA has bubbles around the corresponding blind hole region, which affects the photographing quality, are solved.

In an embodiment as shown in FIG. 5, the display device further includes a protective layer 26. The protective layer 26 is disposed on the cover 25. A projected area of the protective layer 26 on the display panel is equal to the dimension of the display panel.

After digging the cover, the protective layer is disposed on the cover in consideration of protecting the display panel and the polarizer, so that in addition to making the thickness of the display device even, the display panel is prevented from water and oxygen which may enter through the first via hole on the cover, damage the display device, and affect display quality.

In one embodiment, as shown in FIG. 5, the display panel 22 forms a fourth via hole 224 in the electronic component disposing region 221. By forming the fourth via hole on the display panel, light passes through the first via hole, the second via hole, and the third via hole and the enters the electronic component through the fourth via hole. As a result, the light is not blocked so that the light is more or less completely transmitted into the electronic component, thereby enhancing light collection effect of the electronic component.

In an embodiment as shown in FIG. 5, cross-sectional widths of the first via hole, the second via hole, and the third via hole are the same. The cross-sectional width of the first via hole is wider than the cross-sectional width of the fourth via hole. The electronic component collects light through the electronic component disposing region. The first via hole, the second via hole, and the third via hole are wider than the fourth via hole so that the light is more efficiently transmitted into the electronic component through the electronic component disposing region. As a result, the light collection effect is enhanced.

In one embodiment, the display panel includes an LCD panel and an organic light-emitting diode display panel.

Figure 6:
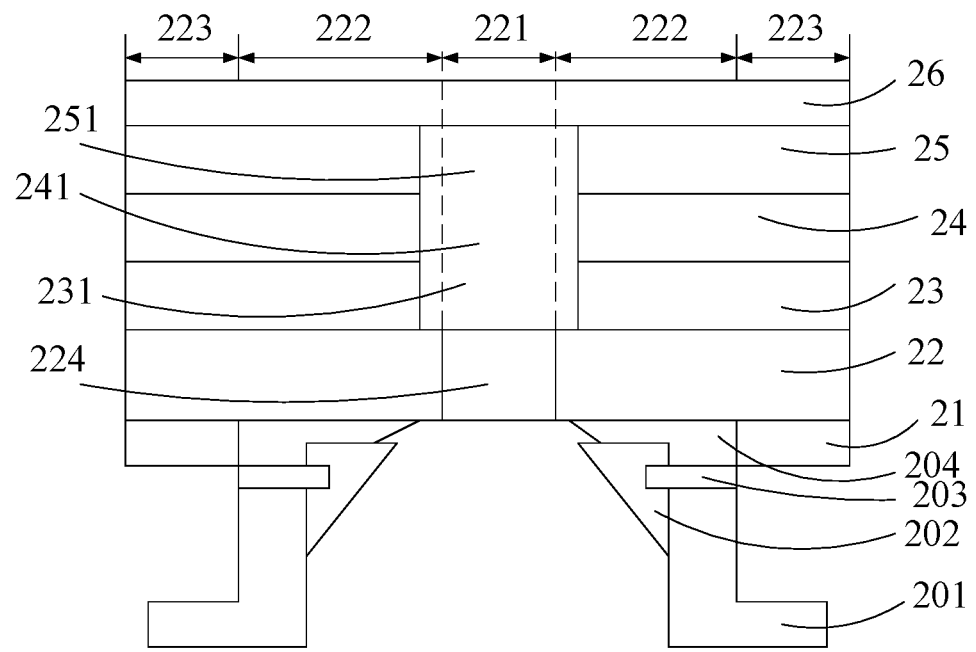
FIG. 6 illustrates a diagram of a liquid crystal display device of an embodiment of the present disclosure.

As shown in FIG. 6, the embodiment of the present disclosure provides an LCD device including a backboard 201, a first light-blocking adhesive 202, a mid-frame 203, a second light-blocking adhesive 204, a first polarizer 21, the display panel 22, a second polarizer 23, the display panel 24, an optically clear adhesive 25, and the cover 26. The LCD device includes an electronic component disposing region 221 corresponding to a location for disposing an electronic component, a display region 223, and a light-blocking region 222 between the electronic component disposing region 221 and the display region 223. The cover 25 forms the first via hole 251 in the electronic component disposing region. The optically clear adhesive 24 forms the second via hole 241 in the electronic component disposing region. The polarizer 23 is forms the third via hole 231 in the electronic component disposing region. The display panel 22 forms the fourth via hole 224 in the electronic component disposing region.

It should be noted that LCD panels include a lower polarizer (i.e. the first polarizer in FIG. 6) and an upper polarizer (i.e. the second polarizer in FIG. 6). The present disclosure focuses on the upper polarizer. The polarizer (i.e. the first polarizer in FIG. 6) refers to the upper polarizer, i.e. the polarizer which is disposed on the display panel, unless the polarizer specifically refers to the lower polarizer.

Figure 7:
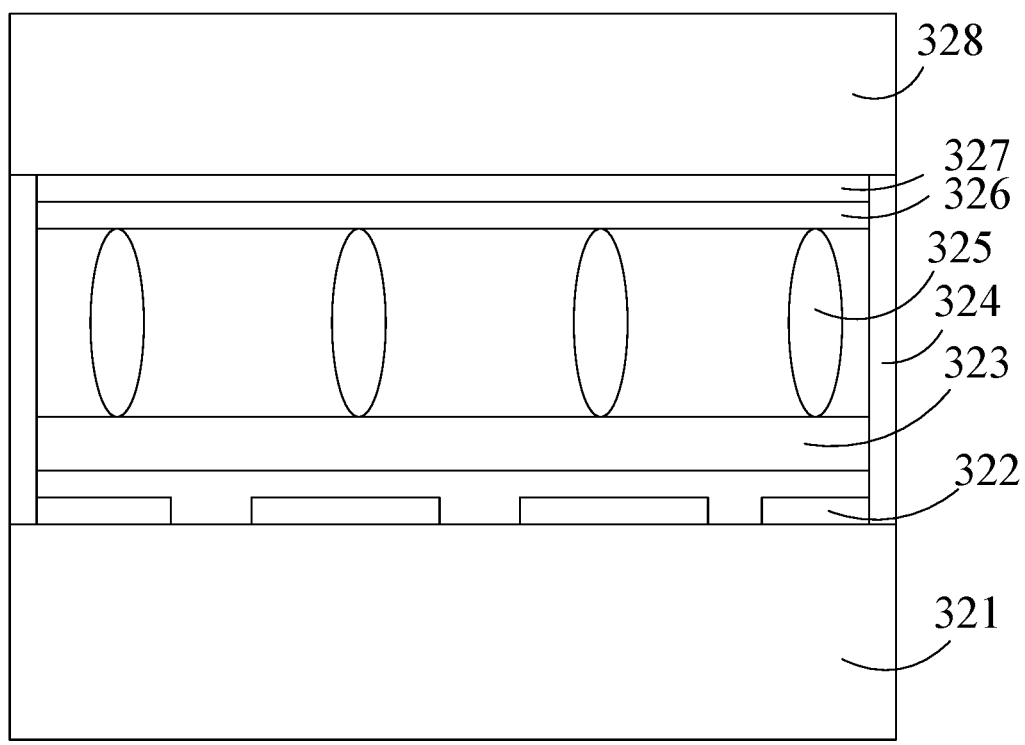
FIG. 7 illustrates a diagram of a liquid crystal display panel of an embodiment of the present disclosure.

As shown in FIG. 7, the embodiment of the present application provides an LCD panel. The LCD panel includes an array substrate 321, a pixel electrode layer 322, a first alignment layer 323, a frame adhesive 324, a liquid crystal layer 325, a second alignment layer 326, a common electrode layer 327, and a color filter substrate 328. Each layer of the LCD panel is processed under the consideration of making light pass through the LCD panel. The array substrate only has to consider that the electronic component disposing region has to be disposed apart from the thin film transistor and connection terminals, and via holes can be provided in regions between the thin film transistors so that light transmittance is improved. The pixel electrode layer, the alignment layers, and the common electrode layer do not require extra processes because each film layer is a transparent material. For the liquid crystal layer, via holes may be provided between the liquid crystals, and the liquid crystals are isolated by the frame adhesive. For the color film layer, a via hole is arranged on a black matrix layer to transmit light. The via hole is disposed in the color film layer corresponding to the black matrix layer so that light can be transmitted to the electronic component through the LCD panel. When manufacturing the LCD panels, the package performances of the LCD panels have to be ensured, and the array substrate, the color filter substrate, and layers which are in contact with the polarizer do not form via holes to prevent the array substrate and the color filter substrate from water and oxygen intrusion and prevent other film layers from caving.

In one embodiment, the first via hole, the second via hole, and the third via hole include transparent materials.

After the first via hole, the second via hole, and the third via hole are formed, the first via hole, the second via hole, and the third via hole can be filled with transparent materials to make the surface of the display device flat and prevent the protective layer from bending and deformation when being disposed on the optically clear adhesive.

In an embodiment, the optically clear adhesive includes one of OCA or UV-OCA. UV-OCA refers to OCA mixed with UV curing agent so that the solidification of OCA is accelerated when performing UV irradiation to the UV-OCA. UV-OCA has better performance than OCA.

In one embodiment, the display device further includes the electronic component. The electronic component includes a camera. The optically clear adhesive is formed with the first via hole for light collection of the camera so that the camera has better performance of collecting light and photographing quality is improved.

In an embodiment, the cover includes a transparent layer. The transparent layer is disposed in a display region corresponding to the display position. The display region is disposed around the electronic component disposing region.

In an embodiment, the material of the transparent layer includes transparent glass.

In an embodiment, the cover further includes the ink layer. The ink layer is disposed in a light-blocking region. A thickness of the ink layer is equal to a thickness of the transparent layer. The light-blocking region is disposed between the display region and the electronic component disposing region in order to prevent reflection, refraction, etc. of the light in the display region so that the light collection of the electronic component is not affected. The cover can adopt ink layers in the light-blocking region, so that the light in the display region and the light collected in electronic component disposing region do not affect each other. In the display device, the light-blocking region is disposed between the display region and the electronic component disposing region. For example, in FIG. 6, a light-blocking adhesive is disposed in the light-blocking region, so that the light transmitted in the display region does not enter the electronic component disposing region to affect the electronic component, the light transmitted in the electronic component disposing region does not enter the display region to affect the display, and the ink layer disposed in the light-blocking region in the cover will not affect the display, thereby improving the light collection efficiency and accuracy of the electronic component.

In an embodiment, the cover further includes the ink layer. The transparent layer is disposed in the light-blocking region. The ink layer is disposed on the transparent layer. The light-blocking region is located between the display region and the electronic component disposing region.

Figure 8:
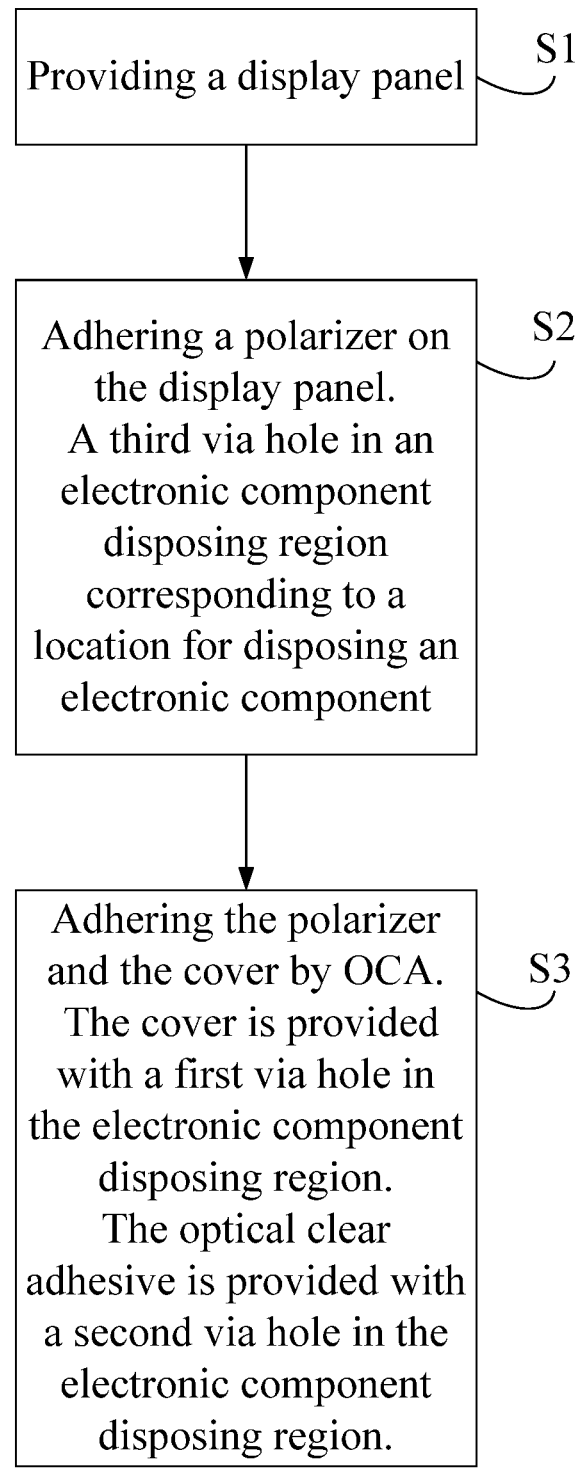
FIG. 8 illustrates a flow chart of a method for manufacturing a display device of an embodiment of the present disclosure.

As shown in FIG. 8, the embodiment of the present disclosure provides a method for manufacturing a display device. The method for manufacturing the display device includes following steps.

Step S1: providing the display panel.

Step S2: adhering a polarizer on the display panel. The polarizer is provided with a third via hole in an electronic component disposing region corresponding to a location for disposing an electronic component.

Step S3: adhering the polarizer and a cover by utilizing an optically clear adhesive. The cover is provided with a first via hole in the electronic component disposing region. The optically clear adhesive is provided with a second via hole in the electronic component disposing region.

The embodiment of the present disclosure provides the method for manufacturing the display device, the manufactured display device includes the cover, the optically clear adhesive, the polarizer, and the display panel. The first via hole is formed in the electronic component disposing region corresponding to the location for disposing an electronic component. The electronic component collects light through the first via hole. The optically clear adhesive is disposed under the cover and provided with the second via hole in the electronic component disposing region. The polarizer is disposed under the optically clear adhesive and is provided with the third via hole in the electronic component disposing region. The display panel is disposed under the polarizer. The first via hole, the second via hole, and the third via hole have overlapping portions. By forming the first via hole on the cover, the optically clear adhesive is not formed in the region corresponding to the first via hole when the optically clear adhesive is formed on the cover. Thus, the optically clear adhesive also forms the second via hole corresponding to the electronic component disposing region, so that the optically clear adhesive does not have portions having different thicknesses. There is no optically clear adhesive in the optical component disposing region. The first via hole, the second via hole, and the third via hole have overlapping portions, so that light is transmitted to the electronic component through the first via hole, the second via hole, and the third via hole. The problems resulting from bubbles forming in the blind hole region are solved. The technical problems of the existing display device that the OCA has bubbles around the corresponding blind hole region, which affects the photographing quality, are solved.

In an embodiment, the step of adhering the polarizer on the display panel includes the following steps.

Providing the polarizer, the polarizer forms the third via hole in the electronic component disposing region.

Adhering the polarizer on the display panel. The third via hold is formed on the polarizer before adhering the polarizer. The third via hold corresponds to the electronic component disposing region of the display panel, and then the polarizer is adhered to the display panel. The method can prevent damage to the display panel when forming the via hole. Alternatively, the third via hold is formed in the electronic component disposing region after adhering the polarizer to the display panel, so that the position of the third via hole more accurately corresponds to the electronic component disposing region of the display panel and the via hole.

In an embodiment, the step of adhering the polarizer and the cover by utilizing OCA on the display panel includes the following steps.

Providing the cover.

Providing the optically clear adhesive on the cover.

Forming the first via hole in the electronic component disposing region on the cover and forming the second via hole on the optically clear adhesive. A projection of the first via hole projecting on the display panel partially overlaps a projection of the second via hole projecting on the display panel.

Adhering the cover and the polarizer through the optically clear adhesive. When adhering the cover and the polarizer through the optically clear adhesive, first, forming the optically clear adhesive on the cover, and then forming the first via hole on the cover in the electronic component disposing region, and forming the second via hole on the optically clear adhesive. When the first via hole and the second via hole are formed by the same manufacturing method, the first via hole and the second via hole can be formed at the same time. And the projections of the first via hole on the display panel and the projections of the second via hole on the display panel have overlapping portions, so that the light is transmitted to the electronic component along the via holes in the cover and in the optically clear adhesive. The bubbles on the optically clear adhesive do not exist, thus light collection is not affected.

In an embodiment, the step of adhering the polarizer and the cover by utilizing OCA on the display panel includes the following steps.

Providing the cover with the first via hole in the electronic component disposing region.

Providing the optically clear adhesive on the cover, the optically clear adhesive is provided with the second via hole in the electronic component disposing region.

Adhering the cover and the polarizer through the optically clear adhesive. When forming the first via hold and the second via hole, the first via hole is formed first so that the OCA cannot be formed in the electronic component disposing region, thereby forming the second via hole.

In an embodiment, the step of providing the cover includes the following steps.

Providing a transparent layer.

Forming an ink layer in a light-blocking region to obtain the cover. The first via hole is provided on the ink layer in the electronic component disposing region. A thickness of the transparent layer is equal to a thickness of the ink layer. The light-blocking region is disposed between the display region and the electronic component disposing region. During providing the cover, the ink layer is formed in the light-blocking region of the cover so that the ink layer can isolate the electronic component disposing region from the display region. As a result, light in the display region and light in the electronic component disposing region do not interfere with each other, and the light collection effect of the electronic component is enhanced.

In an embodiment, the step of providing the cover includes the following steps.

Providing a transparent layer and forming the first via hole in the electronic component disposing region.

Forming an ink layer in a light-blocking region to obtain the cover. The light-blocking region is disposed between the display region and the electronic component disposing region.

The effects are as following according to the above-mentioned embodiments.

The embodiments of the present disclosure provide a cover, a display device, and a method for manufacturing the display device. The display device includes the cover, an optically clear adhesive, a polarizer, and a display panel. A first via hole is formed in an electronic component disposing region corresponding to a location for disposing an electronic component. The electronic component collects light through the first via hole. The optically clear adhesive is disposed under the cover and is provided with a second via hole in the electronic component disposing region. The polarizer is disposed under the optically clear adhesive and is provided with a third via hole in the electronic component disposing region. The display panel is disposed under the polarizer. The first via hole, the second via hole, and the third via hole partially overlap each other. By forming the first via hole on the cover, the optically clear adhesive is not formed in the region corresponding to the first via hole when the optically clear adhesive is formed on the cover. Thus, the optically clear adhesive also forms the second via hole corresponding to the electronic component disposing region, so that the optically clear adhesive does not have portions having different thicknesses. There is no optically clear adhesive in the optical component disposing region. The first via hole, the second via hole, and the third via hole have overlapping portions, so that light is transmitted to the electronic component through the first via hole, the second via hole, and the third via hole. The problems resulting from bubbles forming in the blind hole region are solved. The technical problems of the existing display device that the OCA has bubbles around the corresponding blind hole region, which affects the photographing quality, are solved.

To conclude, although the present disclosure has been disclosed by above-mentioned preferred embodiments, the above-mentioned preferred embodiments are not limitations to the present disclosure. Variations and modifications can be obtained by a person skilled in the art without departing from the aspect and scope of the present disclosure. Therefore, the protected scope of the present disclosure is subject to the scope defined by the claims.

What is claimed is:

1. A cover comprising a first via hole, wherein the first via hole is disposed in an electronic component disposing region corresponding to a location for disposing an electronic component, and the electronic component collects light through the first via hole,
   wherein the cover comprises a transparent layer disposed in a display region corresponding to a display position, and the display region is disposed around the electronic component disposing region, and
   wherein the cover further comprises an ink layer disposed in a light-blocking region, and a thickness of the ink layer is equal to a thickness of the transparent layer, wherein the light-blocking region is located between the display region and the electronic component disposing region.

2. The cover according to claim 1, wherein a material of the transparent layer comprises transparent glass.

3. A display device, comprising:
   a cover comprising a first via hole, wherein the first via hole is disposed in an electronic component disposing region corresponding to a location for disposing an electronic component, and the electronic component collects light through the first via hole;
   an optically clear adhesive disposed under the cover and provided with a second via hole in the electronic component disposing region;
   a polarizer disposed under the optically clear adhesive and provided with a third via hole in the electronic component disposing region; and
   a display panel disposed under the polarizer;
   wherein the first via hole, the second via hole, and the third via hole partially overlap each other,
   wherein the cover comprises a transparent layer disposed in a display region corresponding to a display position, and the display region is disposed around the electronic component disposing region, and
   wherein the cover further comprises an ink layer disposed in a light-blocking region, and a thickness of the ink layer is equal to a thickness of the transparent layer, wherein the light-blocking region is located between the display region and the electronic component disposing region.

4. The display device according to claim 3, wherein the display device further comprises a protective layer disposed on a surface of the cover away from the display panel, and an area of a projection of the protective layer projecting on the display panel is equal to an area of the display panel.

5. The display device according to claim 3, wherein the display panel is provided with a fourth via hole in the electronic component disposing region.

6. The display device according to claim 5, wherein cross-sectional widths of the first via hole, the second via hole, and the third via hole are equal, and the cross-sectional width of the first via hole is greater than a cross-sectional width of the fourth via hole.

7. The display device according to claim 3, wherein the display panel comprises a liquid crystal display panel or an organic light-emitting diode display panel.

8. The display device according to claim 3, further comprising the electronic component, wherein the electronic component comprises a camera.

9. The display device according to claim 3, wherein a material of the transparent layer comprises transparent glass.

10. A method for manufacturing a display device, comprising:
    providing a display panel;
    adhering a polarizer on the display panel, wherein the polarizer is provided with a third via hole in an electronic component disposing region corresponding to a location for disposing an electronic component;
    adhering the polarizer and a cover by utilizing an optically clear adhesive, wherein the cover is provided with a first via hole in the electronic component disposing region, and the optically clear adhesive is provided with a second via hole in the electronic component disposing region,
    wherein the cover comprises a transparent layer and an ink layer, the ink layer is disposed in a light-blocking region, the first via hole is provided on the ink layer in the electronic component disposing region, a thickness of the transparent layer is equal to a thickness of the ink layer, and the light-blocking region is disposed between a display region and the electronic component disposing region.

11. The method for manufacturing the display device according to claim 10, wherein the step of adhering the polarizer and the cover by utilizing the optically clear adhesive comprises:
    providing the cover;
    providing the optically clear adhesive on the cover;
    forming the first via hole in the electronic component disposing region on the cover and forming the second via hole on the optically clear adhesive, wherein a projection of the first via hole projecting on the display panel partially overlaps a projection of the second via hole projecting on the display panel; and
    adhering the cover and the polarizer through the optically clear adhesive.

12. The method for manufacturing the display device according to claim 10, wherein the step of adhering the polarizer and the cover by utilizing the optically clear adhesive comprises:
    providing the cover with the first via hole in the electronic component disposing region;
    providing the optically clear adhesive on the cover, wherein the optically clear adhesive is provided with the second via hole in the electronic component disposing region; and
    adhering the cover and the polarizer through the optically clear adhesive.

* * * * *